United States Patent [19]

Honda

[11] Patent Number: 4,702,370
[45] Date of Patent: Oct. 27, 1987

[54] ELECTRONIC COMPONENTS SERIES

[75] Inventor: Yukio Honda, Nagaokakyo, Japan

[73] Assignee: Murata Manufacturing Co., Ltd., Japan

[21] Appl. No.: 766,264

[22] Filed: Aug. 16, 1985

[30] Foreign Application Priority Data

Aug. 21, 1984 [JP] Japan .................................. 59-173587

[51] Int. Cl.⁴ .............................................. B65D 75/22
[52] U.S. Cl. .................................... 206/331; 206/332; 206/334; 361/419
[58] Field of Search ................................ 206/328–332, 206/334; 361/331, 380, 398, 417–419

[56] References Cited

U.S. PATENT DOCUMENTS

| 3,444,993 | 5/1969 | Lunsford | 206/330 |
| 3,700,100 | 10/1972 | Bohannon, Jr. | 206/332 |
| 4,069,916 | 1/1978 | Fowler et al. | 206/330 |
| 4,071,876 | 1/1978 | Benson et al. | 361/131 |
| 4,193,287 | 3/1980 | Pfeiffer | 206/329 |
| 4,298,120 | 11/1981 | Kaneko et al. | 206/329 |
| 4,411,362 | 10/1983 | Itemadani et al. | 206/330 |
| 4,483,441 | 11/1984 | Akizawa et al. | 206/328 |

FOREIGN PATENT DOCUMENTS

| 3231300 | 2/1984 | Fed. Rep. of Germany | 206/328 |
| 680632 | 10/1952 | United Kingdom . |
| 1383574 | 2/1975 | United Kingdom . |
| 2083001 | 3/1982 | United Kingdom . |
| 2140383 | 11/1984 | United Kingdom . |

Primary Examiner—M. H. Paschall
Assistant Examiner—Gregory P. Thompson
Attorney, Agent, or Firm—Ostrolenk, Faber, Gerb & Soffen

[57] ABSTRACT

An electronic components series comprises a carrier tape and a plurality of recess formed in the carrier tape at equal intervals in the longitudinal direction thereof. An electronic component to be held on the carrier tape comprises a main body and leads or terminals protruding from the main body. Each recess on the carrier tape is shaped so as to be able to store both the above-mentioned main body and leads or terminals. Accordingly, the whole of the electronic component is stored in the recess. A covering tape is bonded to the carrier tape, and accordingly the recess is sealed by the covering tape and the electronic component is held in the recess.

4 Claims, 8 Drawing Figures

ELECTRONIC COMPONENTS SERIES

BACKGROUND OF THE INVENTION

1. Field of the Invention

The present invention relates to an electronic components series. More specifically, the present invention relates to an electronic components series which holds, for example, capacitors, transistors, ICs or the like, which have leads or terminals protruding from the main body thereof.

2. Description of Related Art

FIG. 1 is a plan view showing one example of a conventional electronic components series which forms part of the background of the present invention. This example shows an electronic component 20 (in this case a ceramic capacitor), which has a main body 20a and two leads 20b protruding from this main body 20a. An electronic components series 10 comprises a belt-shaped carrier tape 12, and this carrier tape 12 comprises a base 14 consisting of a paper, plastic or metal. On the base 14, the two leads 20b mounted on the main body 20a of the electronic component 20 are arranged at equal intervals in the longitudinal direction of the base. Then, an adhesive tape 16 is bonded to the base 14 over the leads 20b, and thereby the electronic components 20 are held at equal intervals in the longitudinal direction of the carrier tape 12. In addition, feeding holes 12a are formed on this carrier tape 12.

One electronic components series 10 holds 2,000–5,000 pieces of electronic components 20, and the carrier tape 12 is, for example, folded in a zigzag fashion to be packed in a box, or wound around a reel.

In order to insert the electronic components 20 held on the carrier tape 12, for example, by means of an automatic inserting machine, the feeding holes 12a are engaged by a sprocket wheel to draw out the carrier tape 12 from the box or reel. Then, the two leads 20b of the electronic component 20 are cut to an appropriate length, with the main body 20a being pinched, for example, by a chuck. Then the main body 20a is separated from the carrier tape 12 together with the cut leads 20b, and the leads 20b are inserted into holes on a printed circuit board (not illustrated).

In the conventional electronic components series 10, the main body 20a or one end of the lead 20b, or both, protrude beyond the side of the carrier tape 12, and therefore the electronic components 20 are brought into contact with each other, for example, in packing or transport, resulting in bent leads 20b or mutual entanglement of the electronic components 20. Bending of the leads may cause errors in insertion at the time of automatic insertion.

To eliminate such a disadvantage, it has been considered, for example, to employ an additional layer of paper in folding the carrier tape in zigzag fashion or taking it up on the reel. However, employing the interlayered paper not only increases the cost but also fails to be an effective means for preventing the lead 20b from bending, because the thickness of the main body 20a of the electronic component 20 differs from that of the carrier tape 12.

SUMMARY OF THE INVENTION

Therefore, the principal object of the present invention is to provide an electronic component series which does not cause bending of leads or terminals or mutual entanglement of electronic components.

In brief, the present invention relates to an electronic components series wherein a number of recesses are formed in a belt-shaped holding body at equal intervals in the longitudinal direction thereof and an electronic component is held in each recess with both the main body and the leads or terminals protruding therefrom are received in the recess.

In accordance with an aspect of the present invention, the whole of the main body of the electronic components and the leads or the terminals are stored in the recess, and therefore the electronic component never protrudes beyond the holding body. Accordingly, the leads or the terminals are never bent and the components are never entangled with each other. For this reason, for example, trouble in automatic insertion due to bent leads or terminals or the like can be reduced, and thereby the efficiency of the automatic insertion employing the electronic components series can be improved to a great extent.

Furthermore, in accordance with the present invention, the leads or terminals can be formed in advance having the minimum length required, and therefore a resource-saving can be expected.

Also, as described above, when the leads or terminals of the electronic component are cut in advance so as to have the length required for the a later manufacturing process such as an automatic insertion process, and then the electronic component is stored in the recess series of the holding body, bending of the leads or terminals scarcely takes place, and also no cutting of the leads is required in the automatic insertion process, which is a further improvement.

These objects and other objects, features, aspects and advantages of the present invention will become more apparent from the following detailed description of embodiments of the present invention when taken in conjunction with the accompanying drawings.

DESCRIPTION OF THE PREFERRED EMBODIMENTS

Figure 2:
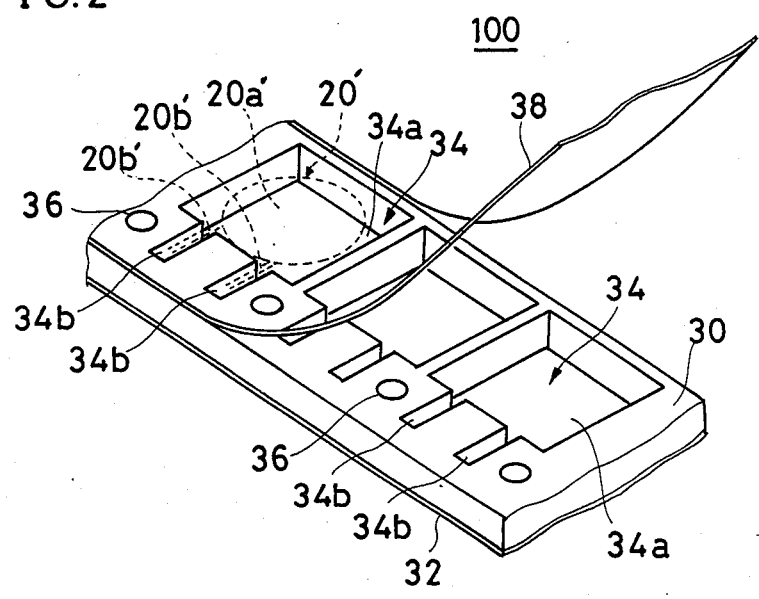
FIG. 2 is a perspective view showing a first embodiment of the present invention.

FIG. 2 is a perspective view showing a first embodiment of the present invention. An electronic components series 100 of the present embodiment comprises a belt-shaped carrier tape 30. This carrier tape 30 is composed of a relatively soft material such as paper, synthetic resin, or metal, and a number of component storing holes are formed therein at equal intervals in the longitudinal direction thereof. Then, a cover tape 32 composed, for example, of paper, synthetic resin sheet or metal film, is bonded to the bottom surface of the carrier tape 30 by means of an adhesive or heat, thereby sealing the bottom opening of the component storing hole to form a recess designated 34.

Figure 3:
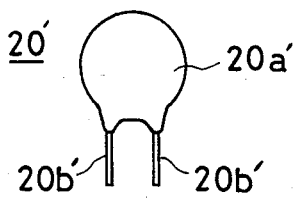
FIG. 3 is a plan view showing an electronic component which is intended to be held by the embodiment of FIG. 2.

In the component storing recess 34, for example, a disc-shaped ceramic capacitor 20' as shown in FIG. 3 may be stored. This ceramic capacitor 20' has a main body 20a' and two leads 20b' which protrude therefrom, the leads having been cut to a length required for a later process. To store such an electronic component as the ceramic capacitor 20', the recess 34 comprises a main body storing part 34a whose flat surface is substantially rectangular and two lead storing parts 34b communicating with one end of this main body storing part 34a.

Figure 1:
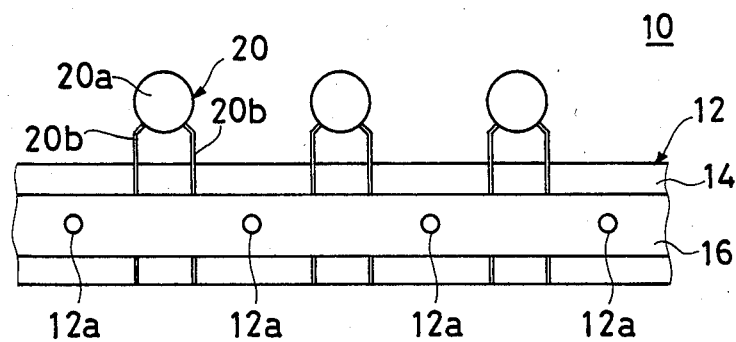
FIG. 1 is a plan view showing one example of a conventional electronic components series.

In the present embodiment, the leads 20b' of the electronic component or the ceramic capacitor 20' have been cut shorter compared with the conventional leads 20b shown in FIG. 1. That is, as described above the leads have been cut to a length required for the later automatic insertion process, for example, 5 mm. Accordingly, for storing the entire electronic component 20' it is not required to increase the width of the carrier tape 30 as much as for storing the component without such cutting. However, if desired, the lead 20b' may be stored with the length thereof left long as in the prior art.

In the recess 34 as described above, the main body 20a' of the electronic component 20' is stored in the main body storing part 34a and the lead 20b' is stored in the lead storing part 34b, respectively. Following such storing, the top opening of the component storing recess 34 is sealed by a cover tape 38 composed, for example, of paper, synthetic resin or a metal film which is bonded to the top surface of the carrier tape 30 by means of an adhesive or heat.

Feeding holes 36 engaging with a sprocket wheel of an automatic inserting machine (not illustrated) are formed between the recesses 34. Preferably, the feeding holes 36 are formed so as to penetrate through the carrier tape 30 in the direction of the thickness of the carrier tape 30. However, these holes may be replaced by recesses in the top or bottom surface of the tape, or may be replaced by notches in an edge of the carrier tape 30. Note that the presence of these feeding holes 36 is not indispensable in the present invention.

In a practical example of the invention, a disc-shaped ceramic capacitor may have a main body 20a' having of a disc shape, the outer diameter of which is, for example, 10 mm. In this case, the width of the carrier tape 30 is set to, for example, 20 mm, and the thickness thereof is set to, for example, 3 mm including the thickness of the cover tape 32. Then, the main body storing part 34a of the component storing recess 34 is a square whose side is 11.5 mm. The lead storing parts 34b are formed at an interval of, for example, 5.0 mm, since the leads 20b' are also formed at an interval of, for example, 5.0 mm. The interval between respective component storing recesses 34 is set to, for example, 12.5 mm. Accordingly, the interval of the feeding holes 36 is also set to 12.5 mm, and the inner diameter of the feeding hole 36 is set to, for example, 2.5 mm.

According to another example, in order to store a ceramic capacitor or electronic component 20' wherein the outer diameter of the main body 20a' is less than 10 mm, for example, 5–7 mm, the width of the carrier tape 30 is set to 15 mm, and for an electronic component 20' wherein the outer diameter of the main body 20a' is, for example, less than 5 mm, the width of the carrier tape 30 can be set to, for example, 10 mm. When the width of the carrier tape 30 is set to 15 mm, the interval of the component storing recesses 34 is set to 10 mm, and when the width of the carrier tape 30 is set to 10 mm, the interval of the component storing recesses 34 may be set to, for example, 7.5 mm.

The above-described specific numeric values are presented for purposes of example only, and the thickness or width of the carrier tape 30, or the dimension of the each part of the component storing hole, or recess 34, has only to be selected most suitably responding to the shape and dimensions of the electronic component 20' to be stored therein and the mechanism of the automatic inserting machine. For example, as in the case with the above-described embodiment, when the main body 20a' is disc-shaped, the main body storing part 34a may be formed in a disc-shape, and when the main body 20a' is rectangular, the main body storing part 34a may be formed as a rectangle.

Furthermore, in the first embodiment the two leads 20b' are stored in different lead storing parts 34b respectively, but it would be possible for the entire component storing recess 34 to be formed as a single rectangle for storing the leads 20b' together with the main body 20a' of the electronic component 20', and the shape of the component storing hole is not necessarily the shape corresponding to the whole shape of the electronic component 20'.

Also, the afore-mentioned lead storing part 34b may be extended up to an edge of the carrier tape 30.

The electronic components series 100 thus formed is then folded in a zigzag fashion to be stored in a box, or wound around a reel like the prior art series, and later is fed to further equipment for an automatic insertion process.

In the above-mentioned embodiment, the component storing recesses 34 formed to open to one side of the carrier tape 30 are formed by first forming holes which are then sealed by the covering tape 32 to form the recesses 34. However, as shown in FIG. 4, these recesses 34 may also be formed by embossing film or sheet material.

Figure 4:
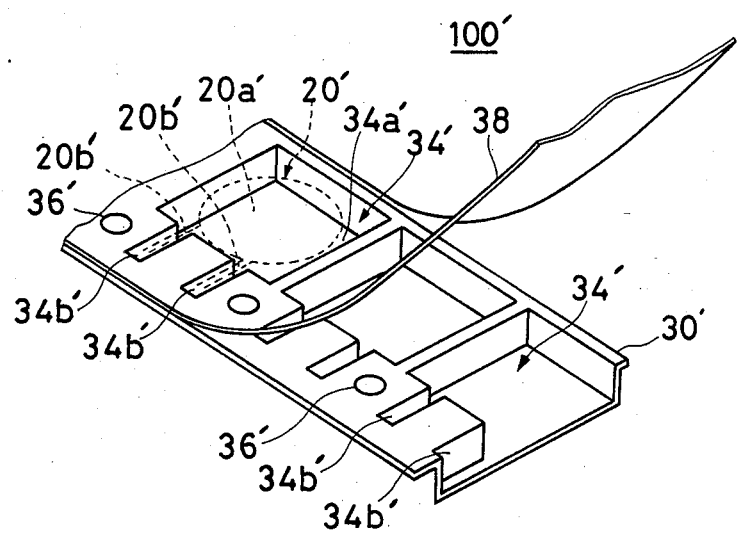
FIG. 4 is a perspective view showing another embodiment of the present invention.

FIG. 4 is a perspective view showing another embodiment of the present invention. The electronic components series 100' of this second embodiment comprises a carrier tape 30' which is formed, for example, by forming synthetic resin. That is, one sheet of synthetic resin is formed to form a plurality of recesses 34' having the same shape as in the previous FIG. 2 embodiment. Each recess 34' comprises a main body storing part 34a responding to the shape or size of the main body 20a', and two lead storing parts 34b' for storing the two leads 20b'. After the electronic components or the ceramic capacitors 20' as shown in FIG. 3 are stored in such component storing recesses 34', these recesses are sealed by the cover tape 38.

IC's, resistors and the like are also electronic components intended to be held by the electronic components series of the present invention, in addition to the capacitor as described above.

FIGS. 5(A), 5(B) 6 and 7 are illustrative views showing other examples of electronic components to be held.

Figure 5A:
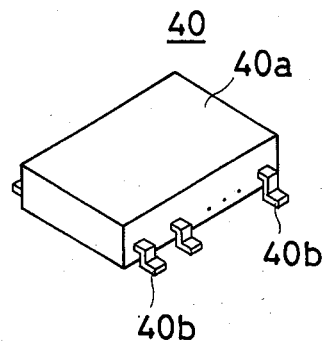
FIGS. 5(A), 5(B), 6 and 7 are views showing other examples of electronic components intended to be held.
Figure 5B:
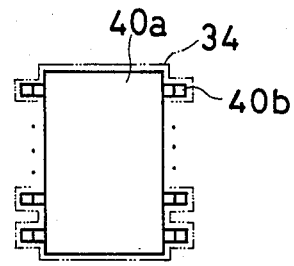

FIGS. 5(A) and 5(B) show an IC or similar-shaped component 40, and this IC or similar-shaped component 40 comprises a main body 40a and a plurality of terminals 40b which are formed protruding from two opposite sides of this main body 40a. To store and hold such an IC or similar-shaped component 40, as shown by dotted lines in FIG. 5(B), for example, the shape of the recess 34 is determined in accordance with the greatest peripheral dimensions of this IC or similar-shaped component 40.

Figure 6:
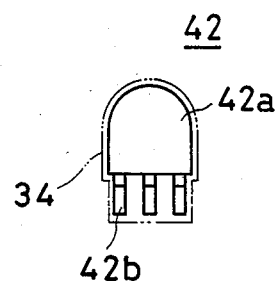

In FIG. 6, a potentiometer 42 is shown as an electronic component to be stored, and this potentiometer 42 comprises a main body 42a and three terminals 42b protruding from the bottom end edge of this main body 42a. To store such a potentiometer 42, the shape of the recess 34 is selected as shown by the dotted line in FIG. 6, for example.

Figure 7:
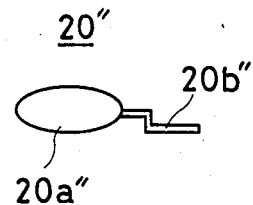

FIG. 7 shows another example of a ceramic capacitor that may be stored. This ceramic capacitor 20'' comprises a main body 20a'' and a lead 20b'', and the lead 20b'' is bent to form an offset at nearly the center thereof.

Although embodiments of the present invention have been described and illustrated in detail, it is clearly understood that the same is by way of illustration and example only and is not to be taken by way of limitation, the spirit and scope of the present invention being defined only by the terms of the appended claims.

What is claimed is:

1. An electronic components series comprising:
   (a) a number of electronic components, each having a main body and a plurality of leads or terminals protruding in the same given direction from said main body,
   (b) a belt-shaped holding body elongated in a longitudinal direction and holding said electronic components,
   a number of recesses being formed in said holding body at equal intervals in the longitudinal direction thereof, each said component being held entirely in a respective one of said recesses,
   each of said recesses including a main body storing portion holding said main body and a leads or terminals storing portion holding said plurality of leads or terminals and extending in said same given direction from said main body storing portion, said main body storing portion and said leads or terminals storing portion being in communication with each other and having different shapes and holding said main body and said leads or terminals, respectively, and each of said leads or terminals storing portions including a plurality of extension portions for receiving respective ones of said plurality of leads or terminals; and
   (c) a sealing tape attached to one main surface of said holding body and sealing said recesses with the main body of said electronic components being stored in said main body storing portions and respective ones of said leads or terminals being stored in corresponding ones of said plurality of extension portions of said leads or terminals storing portions.

2. An electronic components series in accordance with claim 1, wherein said holding body comprises a thick tape-shaped member, and said recesses are formed in said holding body by forming through holes in said tape-shaped member corresponding to the greatest peripheral dimensions of said electronic components, and said through holes are sealed by a second sealing tape on a second main surface of said tape-shaped member, said second main surface being opposite said one main surface.

3. An electronic components series in accordance with claim 1, wherein said holding body comprises a thin sheet member, and said sheet member is formed to form said recesses.

4. An electronic components series in accordance with claim 1, wherein said recesses extend in a direction parallel to said one main surface of said holding body.

* * * * *